(12) United States Patent
Tseng

(10) Patent No.: US 9,543,983 B2
(45) Date of Patent: Jan. 10, 2017

(54) DECODING METHOD, MEMORY STORAGE DEVICE AND MEMORY CONTROL CIRCUIT UNIT

(71) Applicant: PHISON ELECTRONICS CORP., Miaoli (TW)

(72) Inventor: Chien-Fu Tseng, Yunlin County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 114 days.

(21) Appl. No.: 14/475,585

(22) Filed: Sep. 3, 2014

(65) Prior Publication Data

US 2015/0358036 A1 Dec. 10, 2015

(30) Foreign Application Priority Data

Jun. 10, 2014 (TW) .............................. 103120045 A

(51) Int. Cl.
*G06F 11/10* (2006.01)
*H03M 13/11* (2006.01)
*H03M 13/29* (2006.01)
*H03M 13/37* (2006.01)

(52) U.S. Cl.
CPC ...... *H03M 13/1108* (2013.01); *G06F 11/1012* (2013.01); *H03M 13/1128* (2013.01); *H03M 13/3746* (2013.01); *H03M 13/1102* (2013.01); *H03M 13/1171* (2013.01); *H03M 13/2957* (2013.01)

(58) Field of Classification Search
CPC .......... H03M 13/1108; H03M 13/1128; H03M 13/2957; H03M 13/1102; H03M 13/1171; H03M 13/3746

USPC .................................................. 714/785, 763
See application file for complete search history.

(56) References Cited

U.S. PATENT DOCUMENTS

| 8,261,170 B2 * | 9/2012 | Yedidia | H03M 13/1108 714/794 |
| 8,347,194 B2 * | 1/2013 | No | H03M 13/1108 714/784 |
| 8,438,461 B2 * | 5/2013 | Varnica | H03M 13/112 714/774 |
| 8,645,810 B2 * | 2/2014 | Sharon | H03M 13/1128 714/755 |
| 8,707,144 B2 * | 4/2014 | Wang | H03M 13/1108 714/752 |
| 8,739,002 B2 * | 5/2014 | Nakamura | G11B 20/10203 711/118 |
| 8,739,004 B2 * | 5/2014 | Olcay | H03M 13/1108 714/752 |

(Continued)

*Primary Examiner* — James C Kerveros
(74) *Attorney, Agent, or Firm* — Jianq Chyun IP Office

(57) ABSTRACT

A decoding method, a memory storage device and a memory control circuit unit are provided. The decoding method includes: sending a read command sequence for reading multiple memory cells so as to obtain multiple first bits; determining whether the first bits have a first error; if the first bits have the first error, executing a first iteration decoding procedure on the first bits so as to obtain multiple second bits, and recording first bit flipping information of the first iteration decoding procedure; determining whether the second bits have a second error; and If the second bits have the at least one second error, executing a second iteration decoding procedure on the second bits according to the first bit flipping information so as to obtain multiple third bits.

27 Claims, 12 Drawing Sheets

(56) References Cited

U.S. PATENT DOCUMENTS

| | | | |
|---|---|---|---|
| 8,850,295 B2 * | 9/2014 | Chen | H03M 13/1108 |
| | | | 714/780 |
| 8,904,263 B1 * | 12/2014 | Kumar | H03M 13/2906 |
| | | | 714/774 |
| 9,009,578 B1 * | 4/2015 | Varnica | H03M 13/37 |
| | | | 714/785 |

* cited by examiner $$k\left\{\begin{bmatrix} 0 & 0 & 1 & 0 & 1 & 0 & 0 & 1 & 1 \\ 1 & 0 & 0 & 0 & 1 & 0 & 1 & 0 & 0 \\ 0 & 1 & 0 & 1 & 0 & 0 & 0 & 1 & 0 \\ 0 & 1 & 0 & 0 & 1 & 0 & 0 & 1 & 0 \\ 1 & 0 & 0 & 1 & 0 & 0 & 1 & 0 & 1 \\ 0 & 0 & 1 & 1 & 0 & 1 & 0 & 0 & 1 \\ 0 & 1 & 0 & 0 & 1 & 1 & 0 & 0 \\ 1 & 0 & 1 & 0 & 0 & 1 & 0 & 0 & 0 \end{bmatrix}\right.\overbrace{\phantom{xxxxxxxxxxxxxxxx}}^{n}$$

←900

$$\begin{Bmatrix} 0 & 0 & 1 & 0 & 1 & 0 & 0 & 1 & 1 \\ 1 & 0 & 0 & 0 & 1 & 0 & 1 & 0 & 0 \\ 0 & 1 & 0 & 1 & 0 & 0 & 0 & 1 & 0 \\ 0 & 1 & 0 & 0 & 1 & 0 & 0 & 1 & 0 \\ 1 & 0 & 0 & 1 & 0 & 0 & 1 & 0 & 1 \\ 0 & 0 & 1 & 1 & 0 & 1 & 0 & 0 & 1 \\ 0 & 1 & 0 & 0 & 0 & 1 & 1 & 0 & 0 \\ 1 & 0 & 1 & 0 & 0 & 1 & 0 & 0 & 0 \end{Bmatrix} \begin{Bmatrix} 0 \\ 0 \\ 1 \\ 0 \\ 0 \\ 1 \\ 0 \\ 0 \\ 0 \end{Bmatrix} = \begin{Bmatrix} 1 \\ 0 \\ 0 \\ 0 \\ 0 \\ 0 \\ 1 \\ 0 \end{Bmatrix}$$

900     1301     1302

```
  0  0  1  0  1  0  0  1  1
  +  +  +  +  +  +  +  +  +
  0  0  0  0  0  1  0  0  0
  +  +  +  +  +  +  +  +  +
  0  1  0  0  0  0  1  0  0
  ─────────────────────────
  0  1  1  0  1  1  1  1  1
```

Default syndrome weight information

FIG. 13

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 103120045, filed on Jun. 10, 2014. The entirety of the above-mentioned patent application is hereby incorporated by reference herein and made a part of this specification.

BACKGROUND

Technology Field

The present invention relates to a decoding method and more particularly, to a decoding method, a memory storage device and a memory control circuit unit for a rewritable non-volatile memory module.

Description of Related Art

The markets of digital cameras, cellular phones, and MP3 players have expanded rapidly in recent years, resulting in escalated demand for storage media by consumers. Due to having characteristics, such as data non-volatility, low power consumption, compact size and no mechanical structure, the rewritable non-volatile memory module is suitable for being built in the aforementioned portable multi-media devices listed for example.

Generally speaking, in order to ensure data integrity, data to be written into a rewritable non-volatile memory module is encoded. The encoded data is then written into the rewritable non-volatile memory module. The data read from the rewritable non-volatile memory module is decoded by means of a decode procedure. Among a variety of decoding algorithms, a bit flipping decoding algorithm is less complex. However, the bit flipping decoding algorithm also has relatively low rate of decoding success.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to a decoding method, a memory storage device and a memory control circuit unit, which can enhance a success rate of decoding with use of a decoding algorithm having less computational complexity.

According to an exemplary embodiment of the present invention, a decoding method for a rewritable non-volatile memory module having a plurality of memory cells is provided. The decoding method includes the following steps. A read command sequence for reading multiple memory cells is sent so as to obtain a plurality of first bits. Whether the first bits have at least one first error is determined. If the first bits have the first error, a first iteration decoding procedure is executed on the first bits so as to obtain a plurality of second bits, and first bit flipping information of the first iteration decoding procedure is recorded. Whether the second bits have at least one second error is determined. If the second bits have the at least one second error, a second iteration decoding procedure is executed on the second bits according to the first bit flipping information so as to obtain a plurality of third bits. If the second bits do not have the at least one second error, the second bits are output.

According to another exemplary embodiment of the present invention, a memory storage device including a connection interface unit, a rewritable non-volatile memory module and a memory control circuit unit is provided. The connection interface unit is configured to be coupled to a host system. The rewritable non-volatile memory module includes a plurality of memory cells. The memory control circuit unit is coupled with the connection interface unit and the rewritable non-volatile memory module, and is configured to send a read command sequence for reading the plurality of memory cells so as to obtain a plurality of first bits. The memory control circuit unit is further configured to determine whether the first bits have at least one first error. If the first bits have the at least one first error, the memory control circuit unit is further configured to execute a first iteration decoding procedure on the first bits so as to obtain a plurality of second bits and record first bit flipping information of the first iteration decoding procedure. The memory control circuit unit is further configured to determine whether the second bits have at least one second error. If the second bits have the at least one second error, the memory control circuit unit is further configured to execute a second iteration decoding procedure on the second bits according to the first bit flipping information so as to obtain a plurality of third bits. If the second bits do not have the at least one second error, the memory control circuit unit is further configured to output the second bits.

According to an exemplary embodiment of the present invention, a memory control circuit unit is provided, which is configured to control a rewritable non-volatile memory including a plurality of memory cells and includes a host interface, a memory interface, a memory management circuit and an error checking and correcting circuit. The host interface is configured to be coupled to a host system. The memory interface is configured to be coupled to the rewritable non-volatile memory module. The memory management circuit is coupled with the host interface and the memory interface and configured to send a read command sequence for reading multiple memory cells so as to obtain a plurality of first bits. The error checking and correcting circuit is coupled to the memory management circuit and configured to determine whether the first bits have at least one first error. If the first bits have the at least one first error, the error checking and correcting circuit is further configured to execute a first iteration decoding procedure on the first bits so as to obtain a plurality of second bits and record first bit flipping information of the first iteration decoding procedure. The error checking and correcting circuit is further configured to determine whether the second bits have at least one second error. If the second bits have the at least one second error, the error checking and correcting circuit is further configured to execute a second iteration decoding procedure on the second bits according to the first bit flipping information so as to obtain a plurality of third bits. If the second bits do not have the at least one second error, the error checking and correcting circuit is further configured to output the second bits.

In view of one of the exemplary embodiments of the present invention described above, each of the literation decoding procedures is executed with reference to the historic bit flipping information. In this way, even though the decoding algorithm has less computational complexity, the success rate of decoding can be enhanced.

It should be understood, however, that this Summary may not contain all of the aspects and embodiments of the present invention, is not meant to be limiting or restrictive in any manner, and that the present invention as disclosed herein is and will be understood by those of ordinary skill in the art to encompass obvious improvements and modifications thereto.

To make the above features and advantages of the present invention more comprehensible, embodiments accompanied with drawings are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

FIG. 13 is a schematic diagram illustrating a second iteration decoding procedure according to an exemplary embodiment of the present invention.

DESCRIPTION OF EMBODIMENTS

Figure 1:
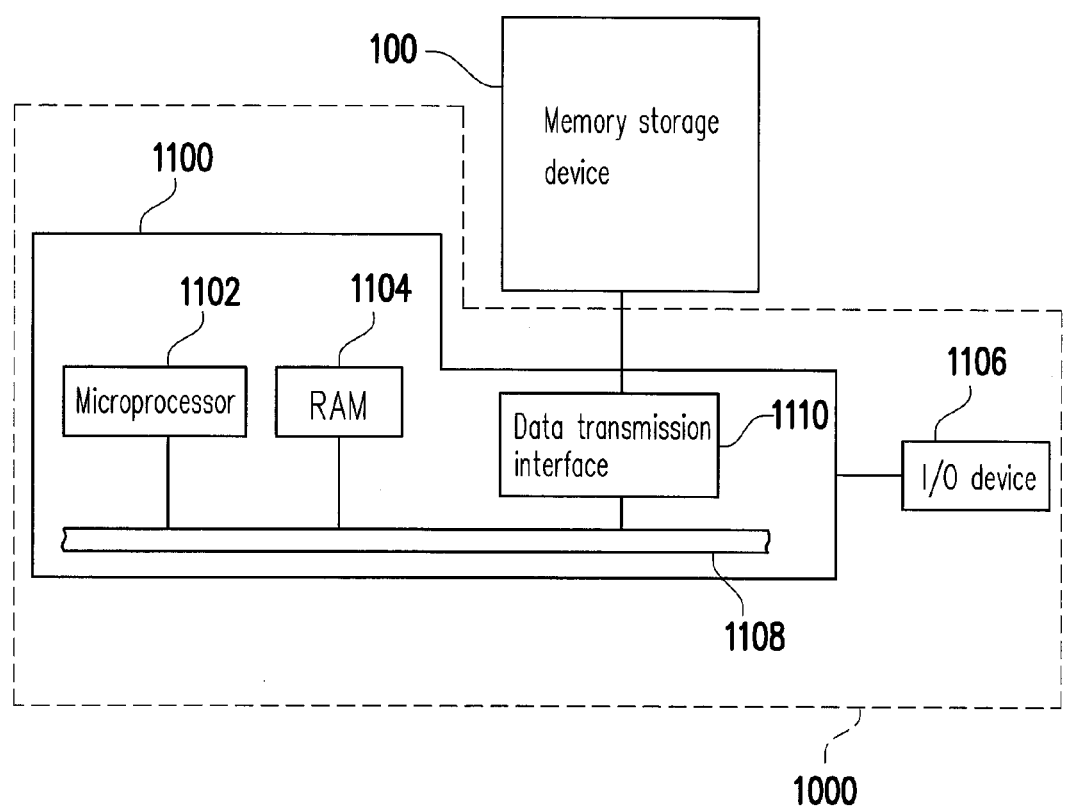
FIG. 1 is a schematic diagram illustrating a host system and a memory storage device according to an exemplary embodiment of the present invention.

Reference will now be made in detail to the present preferred embodiments of the present invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally speaking, a memory storage device (i.e. a memory storage system) includes a rewritable non-volatile memory module and a controller (i.e. a control circuit). The memory storage device is usually used together with a host system, such that the host system can write data into or read data from the memory storage device.

Figure 2:
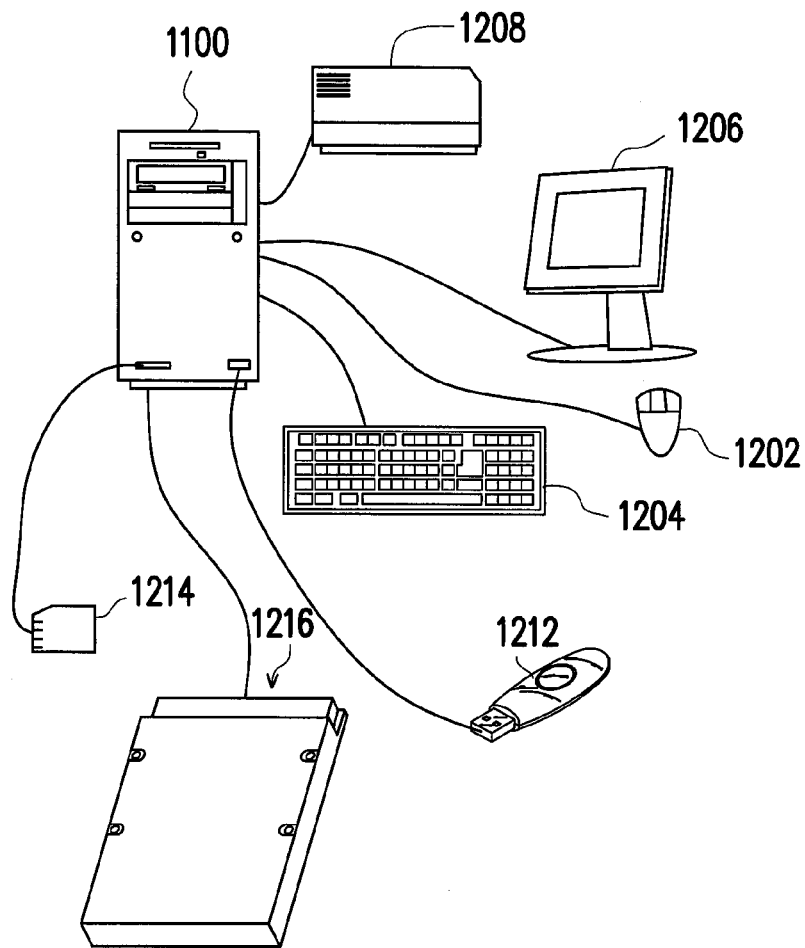
FIG. 2 is a schematic diagram illustrating a computer, an input/output (I/O) device, and a memory storage device according to an exemplary embodiment of the present invention.

FIG. 1 is a schematic diagram illustrating a host system and a memory storage device according to an exemplary embodiment of the present invention. FIG. 2 is a schematic diagram illustrating a computer, an input/output (I/O) device, and a memory storage device according to an exemplary embodiment of the present invention.

Referring to FIG. 1, a host system 1000 generally includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206 and a printer 1208 as shown in FIG. 2. It should be understood that the devices illustrated in FIG. 2 are not intended to limit the I/O device 1106, and the I/O device 1106 may further include other devices.

In an exemplary embodiment, the memory storage device 100 is coupled to other elements of the host system 1000 through the data transmission interface 1110. With the operation of the microprocessor 1102, the RAM 1104 and the I/O device 1106, data can be written into or read from the memory storage device 100. For instance, the memory storage device 100 may be a rewritable non-volatile memory storage device, such as a flash drive 1212, a memory card 1214, or a solid state drive (SSD) 1216, as shown in FIG. 2.

Figure 3:
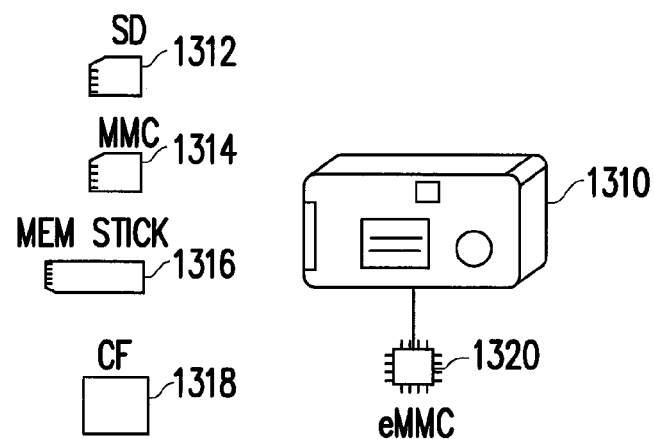
FIG. 3 is a schematic diagram illustrating a host system and a memory storage device according to an exemplary embodiment of the present invention.

FIG. 3 is a schematic diagram illustrating a host system and a memory storage device according to an exemplary embodiment of the present invention.

Generally speaking, the host system 1000 can substantially be any system collocated with the memory storage device 100 for storing data. Even though the host system 1000 is implemented as a computer system in the present exemplary embodiment, in another exemplary embodiment of the present invention, the host system 1000 may be a digital camera, a video camera, a telecommunication device, an audio player, or a video player. For example, in a scenario that the host system 1000 is a digital camera (video camera) 1310, the rewritable non-volatile memory storage device may be a secure digital (SD) card 1312, a multi media card (MMC) 1314, a memory stick 1316, a compact flash (CF) card 1318 or an embedded storage device 1320 (as shown in FIG. 3). The embedded storage device 1320 includes an Embedded MMC (eMMC). It should be mentioned that the eMMC is directly coupled to a substrate of the host system.

Figure 4:
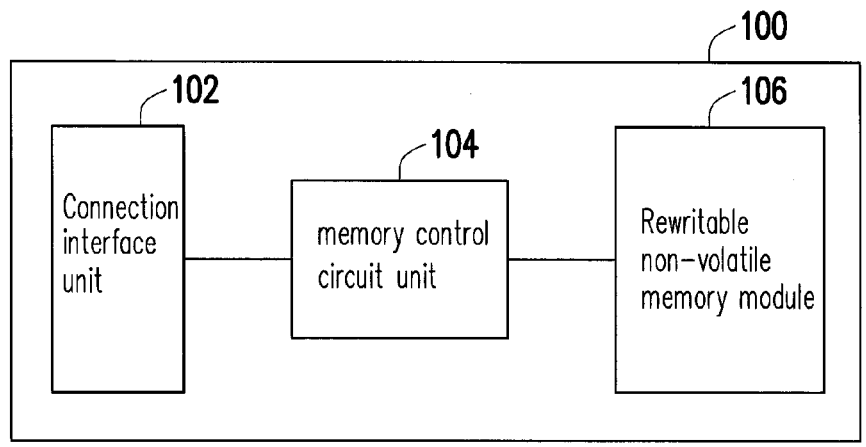
FIG. 4 is a schematic block diagram illustrating the memory storage device shown in FIG. 1.

FIG. 4 is a schematic block diagram illustrating the memory storage device shown in FIG. 1.

Referring to FIG. 4, the memory storage device 100 includes a connection interface unit 102, a memory control circuit unit 104, and a rewritable non-volatile memory module 106.

In the present exemplary embodiment, the connection interface unit 102 complies with a serial advanced technology attachment (SATA) standard. However, it should be understood that the present invention is not limited thereto, and the connection interface unit 102 may also comply with a parallel advanced technology attachment (PATA) standard, an institute of electrical and electronic engineers (IEEE) 1394 standard, a peripheral component interconnect express (PCI Express) standard, a universal serial bus (USB) standard, a secure digital (SD) interface standard, an ultra high speed-I (UHS-I) interface standard, an ultra high speed-II (UHS-II) interface standard, a memory stick (MS) interface standard, a multi media card (MMC) interface standard, an embedded multimedia card (eMMC) interface standard, a universal flash storage (UFS) interface standard, a compact flash (CF) interface standard, an integrated device electronics (IDE) standard, or other suitable standards. The connection interface unit 102 may be package with the memory control circuit unit 104 in one chip or laid outside a chip having the memory control circuit unit 104.

The memory control circuit unit 104 is configured to execute a plurality of logic gates or control commands which are implemented in a hardware form or in a firmware form and perform operations such as data writing, reading or erasing in the rewritable non-volatile memory module 106 according to the command of the host system 1000.

The rewritable non-volatile memory module 106 is coupled to the memory control circuit unit 104 and configured to store data written by the host system 1000. The rewritable non-volatile memory module 106 may be a single-level cell (SLC) NAND flash memory module, a multi level cell (MLC) NAND flash memory module (i.e., a flash memory module capable of storing data of 2 bits in one memory cell), a trinary-level cell (TLC) NAND flash memory module (i.e., a flash memory module capable of storing data of 3 bits in one memory cell), any other flash memory module, or any other memory module with the same characteristics.

Figure 5:
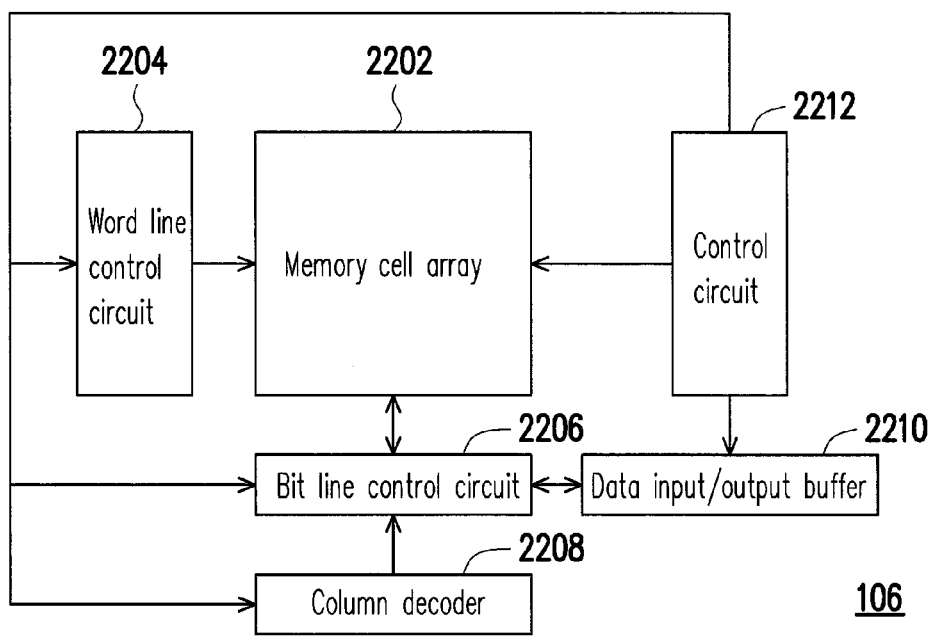
FIG. 5 is a schematic block diagram illustrating a rewritable non-volatile memory module according to an exemplary embodiment of the present invention.
Figure 6:
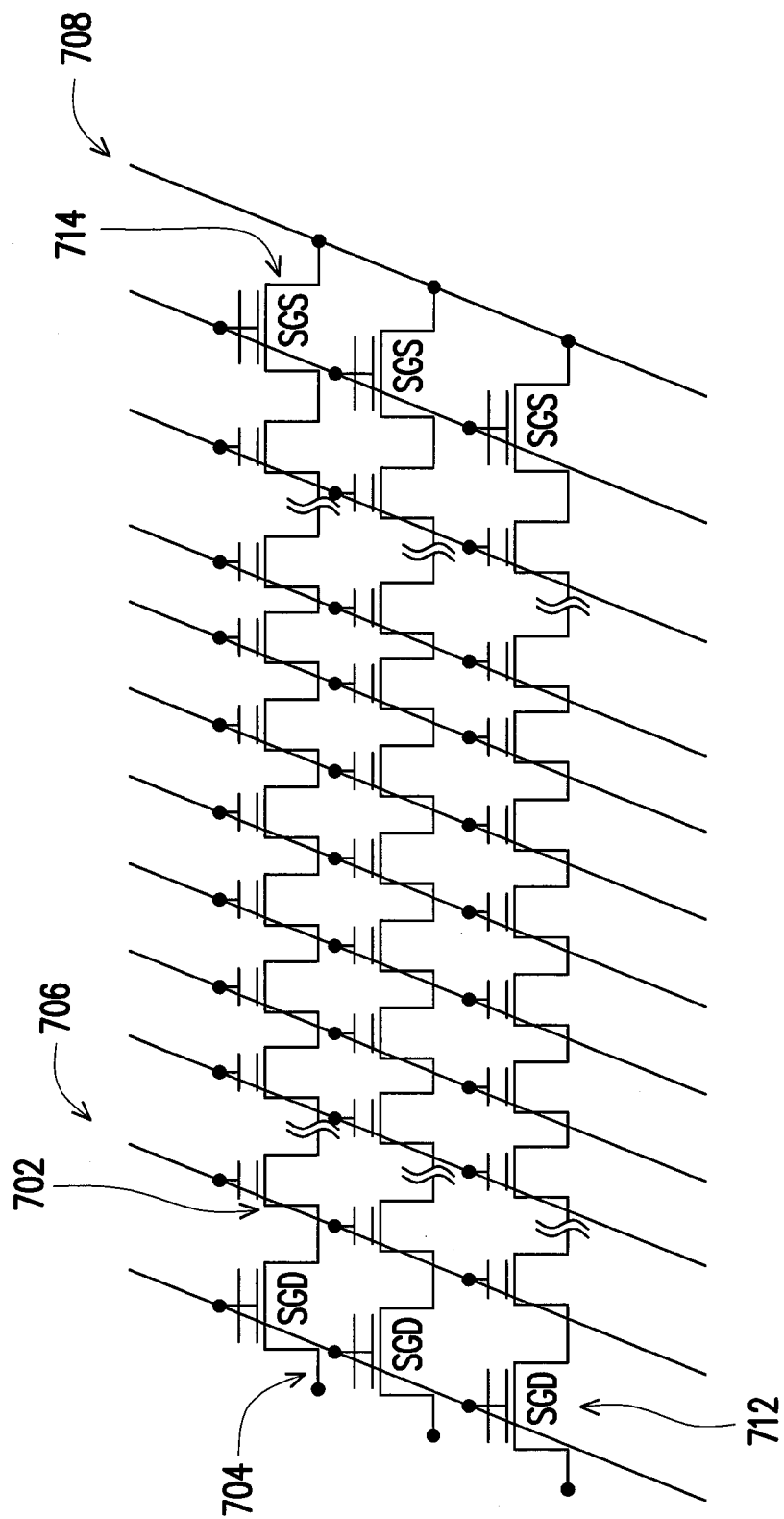
FIG. 6 is a schematic diagram illustrating a memory cell array according to an exemplary embodiment of the present invention.

FIG. 5 is a schematic block diagram illustrating a rewritable non-volatile memory module according to an exemplary embodiment of the present invention. FIG. 6 is a schematic diagram illustrating a memory cell array according to an exemplary embodiment of the present invention.

Referring to FIG. 5, the rewritable non-volatile memory module 106 includes a memory cell array 2202, a word line control circuit 2204, a bit line control circuit 2206, a column decoder 2208, a data input/output buffer 2210 and a control circuit 212.

In the present exemplary embodiment, the memory cell array 2202 includes a plurality of memory cells 702 for storing data, a plurality of select gate drain (SGD) transistors 712, a plurality of select gate source (SGS) transistors 714, and a plurality of bit lines 704, a plurality of word lines 706 and a common source line 708 which are connected with the memory cells 702 (as shown in FIG. 6). The memory cells 702 are disposed at intersections formed by the bit lines 704 and the word lines 706 in an array form (or in a three-dimensional stacking form). When the memory control circuit unit 104 receives a write command or a read command, the control circuit 2212 controls the word line control circuit 2204, the bit line control circuit 2206, the column decoder 2208, the data input/output buffer 2210 to write data into or read data from the memory cell array 2202. Therein, the word line control circuit 2204 is configured to control voltages applied to the word lines 706, the bit line control circuit 2206 is configured to control voltages applied to the bit lines 704, the column decoder 2208 is configured to select the corresponding bit line according to a row address in a command, and the data input/output buffer 2210 is configured to temporarily store the data.

Each of the memory cells in the rewritable non-volatile memory module 106 stores one or more bits by the changing of a threshold voltage. Specifically, there is a charge trapping layer between a control gate and a channel of each memory cell. Through applying a writing voltage to the control gate, an amount of electrons in the charge trapping layer is changed, such that the threshold voltage of the memory cell is changed. This process of the changing of the threshold voltage is also referred to as "writing data into the memory cell" or "programming the memory cell". As the threshold voltage is changed, each of the memory cells of the memory cell array 2202 has a plurality of storage states. Meanwhile, the storage states of the memory cells may be determined through the reading voltages, so as to obtain the one or more bits stored by each of the memory cells.

Figure 7:
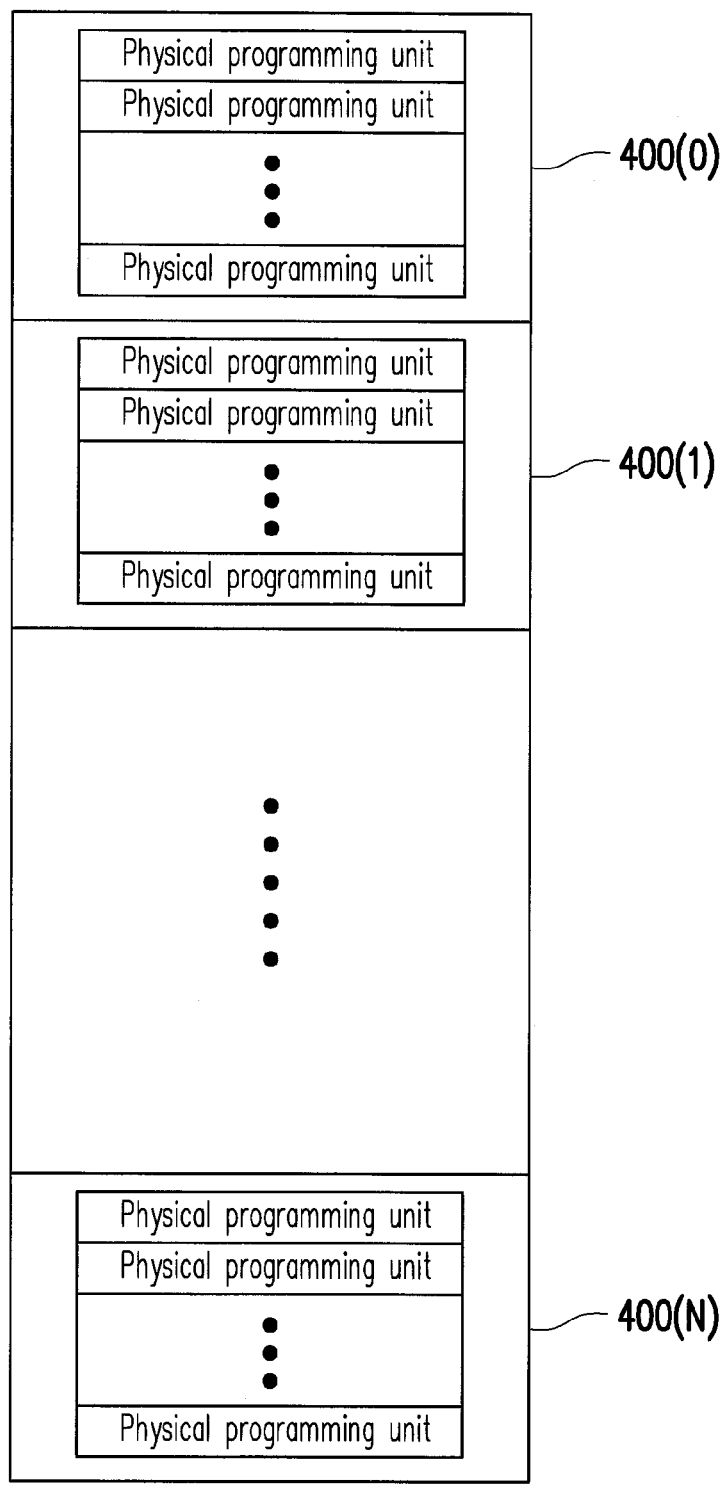
FIG. 7 is a schematic diagram of managing the rewritable non-volatile memory module according to an exemplary embodiment of the present invention.

FIG. 7 is a schematic diagram of managing the rewritable non-volatile memory module according to an exemplary embodiment of the present invention.

Referring to FIG. 7, the memory cells 702 of the rewritable non-volatile memory module 106 constitute a plurality of physical programming units, and the physical programming units constitute a plurality of physical erasing units 400(0) to 400(N). Specifically, the memory cells on the same word line constitute one or more physical programming units. If each memory cell is capable of storing two or more bits, the physical programming units on the same word line may be categorized into lower and upper physical programming units. For example, an LSB of each memory cell belongs to the lower physical programming units, and an MSB of each memory cell belongs to the upper physical programming units. Generally, in a MLC NAND flash memory, a writing speed of the lower physical programming units is greater than a writing speed of upper physical programming units, or reliability of the lower physical programming units is higher than reliability of the upper physical programming units. In the present exemplary embodiment, each physical programming unit is the smallest unit for programming. In other words, each physical programming unit is the smallest unit for writing data. For instance, the physical programming units may be physical pages or physical sectors. In case the physical programming units are the physical pages, each physical programming unit generally includes a data bit area and a redundant bit area. The data bit area includes a plurality of physical sectors for storing data of users, and the redundant bit area is configured for storing system data (e.g., error correcting codes). In the present exemplary embodiment, each data bit area contains 32 physical sectors, and a size of each physical sector is 512 bytes (512B). However, in other exemplary embodiments, the data bit area may contain 8, 16, or a greater or a smaller number of physical sectors, and the present invention is not intended to limit the number and the size of the physical sectors. On the other hand, each physical erasing unit is the smallest unit for erasing. Namely, each physical erasing unit has the least number of memory cells to be erased altogether. For instance, a physical erasing unit is a physical block.

Figure 8:
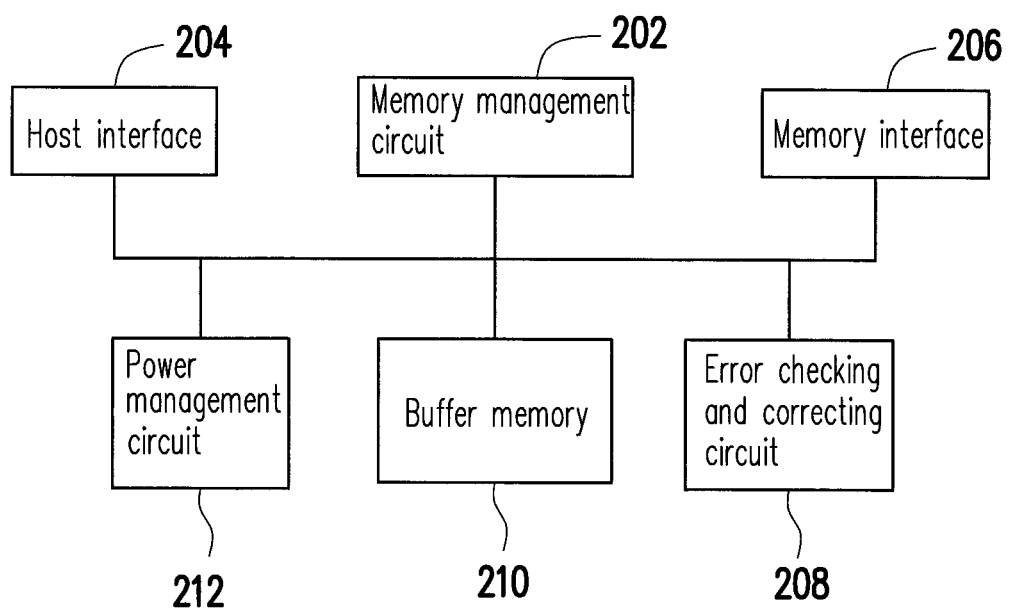
FIG. 8 is a schematic block diagram illustrating a memory control circuit unit according to an exemplary embodiment of the present invention.

FIG. 8 is a schematic block diagram illustrating a memory control circuit unit according to an exemplary embodiment of the present invention.

Referring to FIG. 8, the memory control circuit unit 104 includes a memory management circuit 202, a host interface 204, a memory interface 206, and an error checking and correcting circuit 208.

The memory management circuit 202 is configured to control the overall operation of the memory control circuit unit 104. Specifically, the memory management circuit 202 has a plurality of control commands, and when the memory storage device 100 is operated, the control commands are executed to perform various data operations, such as data writing, data reading and data erasing. Operations of the memory management circuit 202 are equivalent to the operations of the memory control circuit unit 104, and thus, related description is not repeated hereinafter.

In the present exemplary embodiment, the control commands of the memory management circuit 202 are implemented in a firmware form. For instance, the memory management circuit 202 has a microprocessor unit (not shown) and a read-only memory (not shown), and the control commands are burnt into the read-only memory. When the memory storage device 100 is operated, the control commands are executed by the microprocessor unit to perform various data operations, such as data writing, data reading or data erasing.

In another exemplary embodiment, the control commands of the memory management circuit 202 may also be stored in a specific area (e.g., a system area in the memory module exclusively used for storing the system data) of the rewritable non-volatile memory module 106 as program codes. Moreover, the memory management circuit 202 has a microprocessor unit (not shown), a read-only memory (not shown), and a random access memory (not shown). Specifically, the read-only memory has a boot code. When the memory controller 104 is enabled, the microprocessor unit first executes the boot code to load the control commands stored in the rewritable non-volatile memory module 106 into the random access memory of the memory management circuit 202. Afterwards, the microprocessor unit executes the control commands for various data operations such as data writing, data reading and data erasing.

Additionally, in another exemplary embodiment, the control commands of the memory management circuit 202 may also be implemented in a hardware form. For example, the memory management circuit 202 includes a microcontroller, a memory management circuit, a memory writing circuit, a memory reading circuit, a memory erasing circuit and a data processing circuit. The memory management circuit, the memory writing circuit, the memory reading circuit, the memory erasing circuit and the data processing circuit are coupled to the microcontroller. The memory management circuit is configured to manage the physical erasing units of the rewritable non-volatile memory module 106, the memory writing circuit is configured to issue a write command to the rewritable non-volatile memory module 106 for writing data to the rewritable non-volatile memory module 106, the memory reading circuit is configured to issue a read command to the rewritable non-volatile memory module 106 for reading data therefrom, the memory erasing circuit is configured to issue an erase command to the rewritable non-volatile memory module 106 for erasing data therefrom, and the data processing circuit is configured to process data to be written to the rewritable non-volatile memory module 106 or data read from the rewritable non-volatile memory module 106.

The host interface 204 is coupled to the memory management circuit 202 and configured to receive and identify commands and data transmitted from the host system 1000. Namely, the commands and data sent by the host system 1000 are transmitted to the memory management circuit 202 through the host interface 204. In the present exemplary embodiment, the host interface 204 complies with the SATA standard. However, it should be understood that the present invention is not limited thereto, and the host interface 204 may also comply with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 206 is coupled to the memory management circuit 202 for accessing to the rewritable non-volatile memory module 106. In other words, the data to be written into the rewritable non-volatile memory module 106 is converted to a format acceptable for the rewritable non-volatile memory module 106 by the memory interface 206.

The error checking and correcting circuit 208 is coupled to the memory management circuit 202 and configured to execute an error checking and correcting procedure to ensure the accuracy of data. To be specific, when the memory management circuit 202 receives a write command from the host system 1000, the error checking and correcting circuit 208 generates an error correcting code (ECC) and/or error detecting code (EDC) corresponding to the write command for the data, and the memory management circuit 202 writes the data corresponding to the write command and the corresponding ECC or EDC into the rewritable non-volatile memory module 106. Subsequently, when reading the data from the rewritable non-volatile memory module 106, the memory management circuit 202 simultaneously reads the corresponding ECC or the EDC, and the error checking and correcting circuit 208 executes an error checking and correcting procedure on the read data based on the ECC or the EDC.

In an exemplary embodiment, the memory control circuit unit 104 further includes a buffer memory 210 and a power management circuit 212.

The buffer memory 210 is coupled to the memory management circuit 202 and configured to temporarily store data and commands from the host system 1000 or data from the rewritable non-volatile memory module 106.

The power management circuit 212 is coupled to the memory management circuit 202 and configured to control the power of the memory storage device 100.

In the present exemplary embodiment, the error checking and correcting circuit 208 employs a low density parity check code (LDPC). However, in another exemplary embodiment, the error checking and correcting circuit 208 may also employ BCH code, convolutional code or turbo code, which is not limited in the present invention.

In the present exemplary embodiment, the error checking and correcting circuit 208 encodes and decodes according to an LDPC algorithm. In an LDPC code, a valid codeword is defined by using a parity check matrix. Hereinafter, a parity check matrix is marked as H, and a codeword is marked as CW. According to an equation (1) below, in case a result calculated by multiplying the parity check matrix H by the codeword CW is a zero vector, it indicates that the codeword CW is the valid codeword. Therein, an operator $\otimes$ represents a mod-2 matrix multiplication. In other words, a null space of the matrix H includes all the valid codewords. However, the present invention is not intended to limit the content of the codeword CW. For instance, the codeword CW may also include an ECC or an EDC generated by using any algorithm.

$$H \otimes CW^T = 0 \tag{1}$$

Therein, a dimension of the matrix H is k-by-n, and a dimension of the codeword CW is 1-by-n, where k and n are positive integers. The codeword CW includes message bits and parity bits. Namely, the codeword CW may be represented by [M P], in which a vector M is constituted by the message bits, and a vector P is constituted by the parity bits. A dimension of the vector M is 1-by-(n-k), and a dimension of the vector P is 1-by-k. Hereinafter, the message bits and the parity bits are collectively referred to as data bits. In other words, the codeword CW includes n data bits, where a length of the message bits is (n-k) bits, and a length of the parity bits is k bits. Namely, a code rate of the codeword CW is (n-k)/n.

Generally, a generation matrix (marked as G hereinafter) is used during decoding, so that an equation (2) below may be satisfied by arbitrary values of the vector M, where a dimension of the generation matrix G is (n-k)-by-n.

$$M \otimes G = [MP] = CW \tag{2}$$

Therein, the codeword CW generated by the equation (2) is the valid codeword. Therefore, when the equation (2) is substituted into the equation (1), an equation (3) below may be obtained accordingly.

$$H \otimes G^T \otimes M^T = 0 \tag{3}$$

Since the vector M may be arbitrary values, an equation (4) below is definitely satisfied. In other words, after the parity check matrix H is determined, the corresponding generation matrix G may also be determined.

$$H \otimes G^T = 0 \tag{4}$$

When decoding the codeword CW, a parity check procedure is first executed on the data bits in the codeword. For instance, the parity check matrix H may be multiplied by the codeword CW to generate a vector (which is marked as S hereinafter, as shown in an equation (5) below). If it is assumed that the vector S is the zero vector, the codeword CW may be directly output. If it is assumed that the vector S is not the zero vector, it indicates that the codeword CW is not the valid codeword.

$$H \otimes CW^T = S \tag{5}$$

A dimension of the vector S is k-by-1, in which each element is referred to as a syndrome. If the codeword CW is not the valid codeword, the error checking and correcting circuit 208 executes a decoding procedure attempting to correct one or more error bits in the codeword CW. In an exemplary embodiment, the error checking and correcting circuit 208 executes an iteration decoding procedure for decoding. Namely, the decoding procedure is repeatedly executed until the codeword is successfully decoded or counts for executing the decoding procedure reaches a predetermined threshold.

Figures 9, 10:
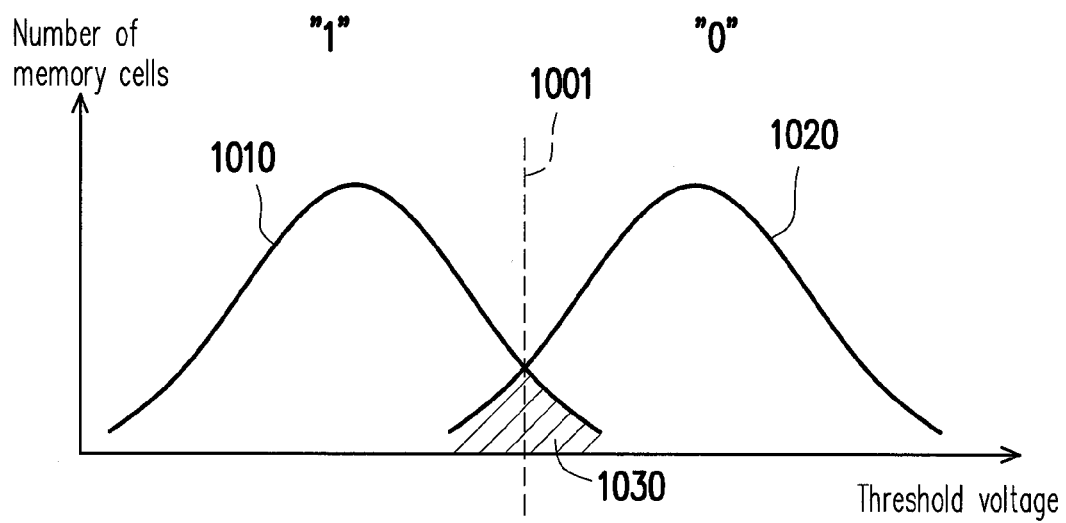
FIG. 9 is a schematic diagram illustrating a parity check matrix according to an exemplary embodiment of the present invention.
FIG. 10 is a schematic diagram illustrating a threshold voltage distribution of a SLC-type flash memory module according to an exemplary embodiment of the present invention.

FIG. 9 is a schematic diagram illustrating a parity check matrix according to an exemplary embodiment of the present invention.

Referring to FIG. 9, a dimension of a parity check matrix 900 is 8-by-9, where the values of the integers k and n are not limited in the present invention. Each row of the parity check matrix 900 represents a constrain. Taking the first row of the parity check matrix 900 for example, if it is assumed that a certain codeword therein is valid, the bit "0" is obtained after performing a modulo-2 addition on the 3rd, 5th, 7th and 8th bits in the codeword. Persons of ordinary skills in the art should be able to understand how to encode by using the parity check matrix 900, which will not be repeated described hereinafter. Additionally, the parity check matrix 900 is illustrated as example matrix, which construes no limitations to the present invention.

When the memory management circuit 202 is about to write a plurality of bits to the rewritable non-volatile memory module 106, the error checking and correcting circuit 208 generates k parity bits corresponding to (n-k) bits (i.e., the message bits) which is to be written. Then, the memory management circuit 202 serves the n bits as a codeword which is to be written into the rewritable non-volatile memory module 106.

FIG. 10 is a schematic diagram illustrating a threshold voltage distribution of a SLC-type flash memory module according to an exemplary embodiment of the present invention.

Referring to FIG. 10, a horizontal axis represents a threshold voltages of memory cells, and a vertical axis represents a number of the memory cells. For instance, FIG. 10 illustrates the threshold voltage of each memory cell in one physical programming unit. It is assumed that, when the threshold voltage of one specific memory cell falls in a distribution 1010, the bit stored in the memory cell is the bit "1". Otherwise, when the threshold voltage of one specific memory cell falls in a distribution 1020, the bit stored in the memory cell is the bit "0". It is to be mentioned that, the present exemplary embodiment takes the SLC-type flash memory module for example, and thus, there are two possible distributions for the threshold voltages. However, in other exemplary embodiments, the threshold voltages may include four, eight or any number of possible distributions, and a read voltage may fall between any two of the distributions. In addition, the bit represented by each distribution is not particularly limited in the present invention.

In a scenario that data is to be read from the rewritable non-volatile memory module 106, the memory management circuit 202 sends a read command sequence to the rewritable non-volatile memory module 106. The read command sequence includes one or more commands or program codes, and is configured to instruct to read a plurality of memory cells of one physical programming unit to obtain a plurality of bits (also referred to as first bits). For instance, the plurality of memory cells of the physical programming unit is read based on a read voltage 1001. If a memory cell has a threshold voltage lower than the read voltage 1001, the memory cell is turned on, and the bit "1" is read by the memory management circuit 202. Otherwise, if a memory cell has a threshold voltage greater than the read voltage 1001, the memory cell is not turned on, and the bit "0" is read by the memory management circuit 202.

It is to be noted that the distribution 1010 and the distribution 1020 contain an overlap area 1030. The overlap area 1030 indicates that some of the memory cells should store the bit "1" (belonging to the distribution 1010), but have the threshold voltage greater than the read voltage 1001, or alternatively, some of the memory cells should store the bit "0" (belonging to the distribution 1020), but have the threshold voltage lower than the read voltage 1001. In other words, part of the bits among the read bits have errors. In another exemplary embodiment, it may also be a scenario that a plurality of bits are read from one memory cell, and the present invention is not limited thereto. Additionally, a one-time reading operation may be performed to read a plurality of memory cells from one physical sector or any number of memory cells, which is not limited in the present invention.

The error checking and correcting circuit 208 determines whether the first bits have one or more errors (also referred to as first errors). For example, in the present exemplary embodiment, the error checking and correcting circuit 208 executes a parity check procedure on the first bits to obtain a plurality of syndromes, where each of the first bits is corresponding to at least one of the syndromes. In other words, the syndromes may form the vector S. In an exemplary embodiment, the vector S is also referred to as a syndrome vector. The error checking and correcting circuit 208 determines whether the first bits have the one or more first errors according to the syndromes in the syndrome vector S. For instance, in case each of the syndromes in the syndrome vector S is "0", the error checking and correcting circuit 208 determines that the first bits do not have the first errors, and that a codeword composed of the first bits is valid. In case one or more syndromes in the syndrome vector S is "1", the error checking and correcting circuit 208 determines that the first bits have the first errors, and that a codeword composed of the first bits is not valid.

Figure 11:
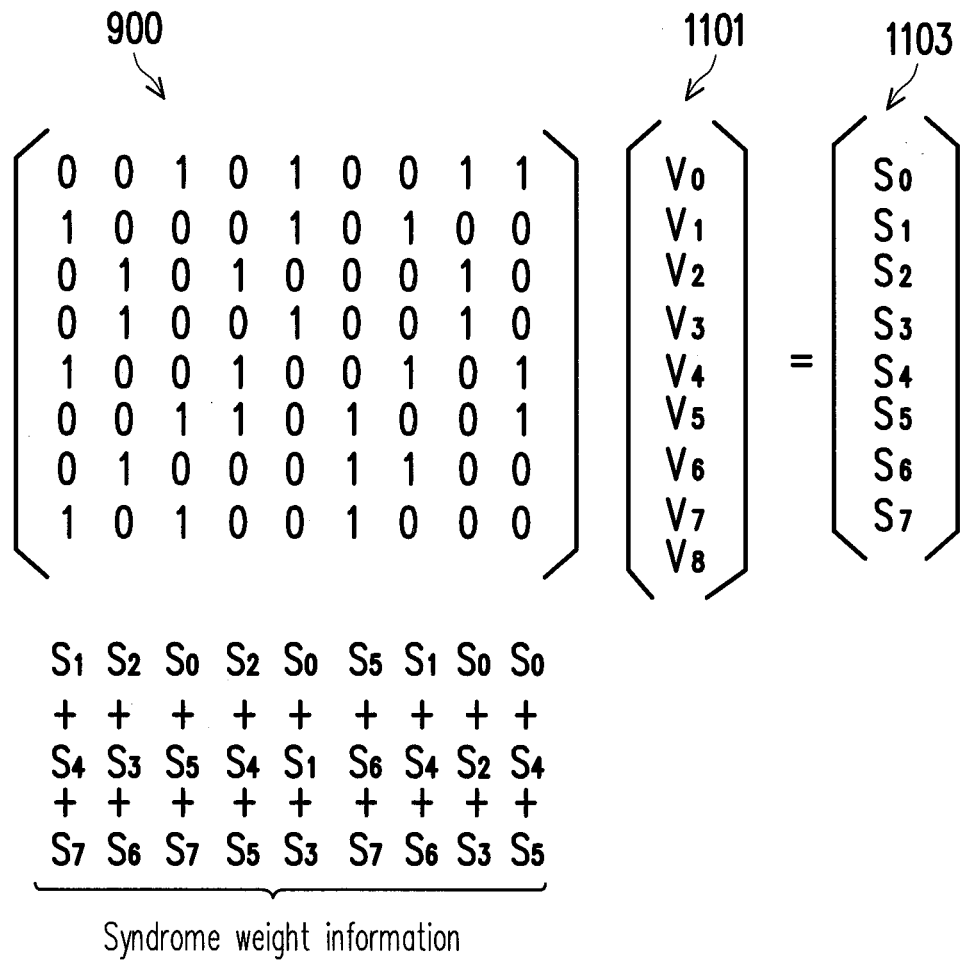
FIG. 11 is a schematic diagram illustrating a matrix multiplication according to an exemplary embodiment of the present invention.

FIG. 11 is a schematic diagram illustrating a matrix multiplication according to an exemplary embodiment of the present invention.

Referring to FIG. 11, a multiplication result of the parity check matrix 900 by a codeword 1101 is a syndrome vector 1103. Each of the first bits in the codeword 1101 is corresponding to at least one of the syndromes in the syndrome vector 1103. For example, the first bit $V_0$ among the first bits in the codeword 1101 (corresponding to the first column in the parity check matrix 900) is corresponding to syndromes $S_1$, $S_4$ and $S_7$. The first bit $V_1$ (corresponding to the second column in the parity check matrix 900) among the first bits is corresponding to syndromes $S_2$, $S_3$ and $S_6$, and son on, likewise. In case the error occurs in the first bit $V_0$, the syndromes $S_1$, $S_4$ and $S_7$ may probably be "1". In case the error occurs in the first bit $V_1$, the syndromes $S_2$, $S_3$ and $S_6$ may probably be "1", and so on, likewise.

If no error occurs in the first bits in the codeword 1101, it indicates a decoding success, and the error checking and correcting circuit 208 outputs the first bits of the codeword 1101. If the first bits have the one or more first errors, the error checking and correcting circuit 208 executes a iteration decoding procedure (also referred to as a first iteration decoding procedure) on the first bits so as to obtain a plurality of decoding bits (also referred to as second bits).

In the first iteration decoding procedure, the error checking and correcting circuit 208 obtains syndrome weight information of the first bits according to the syndromes. For instance, the error checking and correcting circuit 208 obtains the syndrome weight information of the first bits according to the syndromes corresponding to each of the first bits. For example, the error checking and correcting circuit 208 may add the syndromes corresponding to the same first bit to obtain the syndrome weight information of the first bit. Referring to FIG. 11, the syndrome weight information of the first bit $V_0$ is equal to the sum of the syndromes $S_1$, $S_4$ and $S_7$, and the syndrome weight information of the first bit $V_1$ is equal to the sum of the syndromes $S_2$, $S_3$ and $S_6$, and so on, likewise. It should be noted that the addition performed on the syndromes $S_0$ to $S_7$ is normal addition, rather than the modulo-2 addition. In other words, the error checking and correcting circuit 208 can obtain the syndrome weight information of the second bits according to an equation (6) below.

$$f_1 = S^T \times H \quad (6)$$

Therein, a vector $f_1$ may be used to represent the syndrome weight information of each of the first bits.

The error checking and correcting circuit 208 may also multiply each of the syndromes by a weight and accumulate results of multiplying the syndromes by the weights to obtain the syndrome weight information of the first bits. For example, the syndrome weight information of the first bit $V_0$ may be equal to $(W_1 S_1 + W_4 S_4 + W_7 S_7)$, where weights $W_1$, $W_4$ and $W_7$ are real numbers. The weight corresponding to each syndrome may be the same or different. In this exemplary embodiment, the weight corresponding to each syndrome is 1. In another exemplary embodiment, the error checking and correcting circuit 208 may determine the weight corresponding to each syndrome according to whether the syndrome is "1" or "0". For example, if a syndrome is "1", the weight corresponding to the syndrome is "1", while if a syndrome is "0", the weight corresponding to the syndrome is "−1". Alternatively, the error checking and correcting circuit 208 may also determine the weight according to the number of the first bits corresponding to the syndromes. For example, the syndrome $S_0$ is corresponding to four first bits, and the syndrome $S_1$ is corresponding to three first bits. In this case, the error checking and correcting circuit 208 may set the weight $W_0$ to be less (or greater) than the weight $W_1$. The present invention is not intended to limit how to set the weight of each syndrome. In another exemplary embodiment, the error checking and correcting circuit 208 may also employ at least one of the syndromes $S_0$ to $S_7$ as an input of a function and employ an output of the function as the syndrome weight information. The aforementioned function may be a linear function, a polynomial function, an exponential function or any other non-linear function, which is not limited in the present invention.

The error checking and correcting circuit 208 flips at least one of the first bits according to the syndrome weight information of the first bits. For example, the error checking and correcting circuit 208 flips one or more first bits from "1" to "0", or from "0" to "1". In an exemplary embodiment, the operation of flipping the bits is also referred to as bit flipping. Specifically, the error checking and correcting circuit 208 determines whether the syndrome weight information of each of the first bits in the codeword 1101 meets a weight condition. For example, the error checking and correcting circuit 208 determines whether a value of the syndrome weight information of each of the first bits is greater than a threshold. If a value of the syndrome weight information of a certain first bit is greater than the threshold, the error checking and correcting circuit 208 determines that the syndrome weight information of the first bit meets the weight condition, and then flips the first bit. In an exemplary embodiment, only one bit in a codeword is flipped in each of the iteration decoding procedures. For example, the value of the syndrome weight information of the flipped bit is greater than the value of the syndrome weight information of the other unflipped bits. However, in another exemplary embodiment, a plurality of or none of the bits in a codeword may be flipped in each of the iteration decoding procedures.

Figure 12:
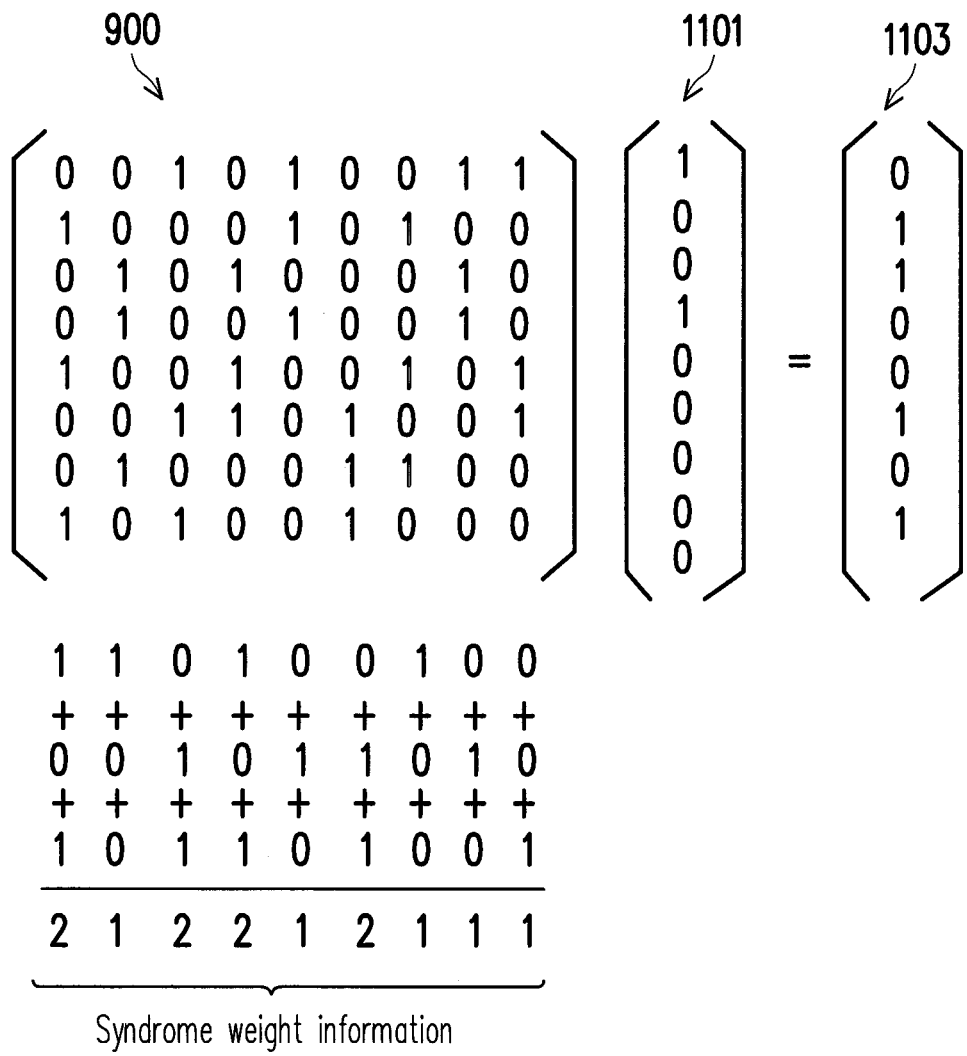
FIG. 12 is a schematic diagram illustrating a first iteration decoding procedure according to an exemplary embodiment of the present invention.

FIG. 12 is a schematic diagram illustrating a first iteration decoding procedure according to an exemplary embodiment of the present invention.

Referring to FIG. 12, it is assumed that the first bits $V_0$ to $V_8$ in the codeword 1101 are "1", "0", "0", "1", "0", "0", "0", "0" and "0", the syndromes $S_0$ to $S_7$ in the syndrome vector 1103 are "0", "1", "1", "0", "0", "1", "0" and "1", and the weight corresponding to each syndrome in the syndrome vector 1103 is "1". According to the equation (6), the error checking and correcting circuit 208 can obtain the vector $f_1$ serving to indicate that the syndrome weight information of each of the first bits $V_0$ to $V_8$ is "2", "1", "2" "2", "1", "2", "1", "1" and "1". The error checking and correcting circuit 208 may set the threshold as "2" and that the bits $V_0$, $V_2$, $V_3$ and $V_5$ having the syndrome weight information greater than or equal to "2" are to be flipped. Then, a plurality of second bits are output by the first iteration decoding procedure. The second bits are respectively "0", "0", "1", "0", "0", "1", "0", "0" and "0", for example. In other words, the second bits include a plurality of flipped first bits and a plurality of unflipped first bits.

On the other hand, the error checking and correcting circuit 208 records bit flipping information (also referred to as first bit flipping information) of the first iteration decoding procedure. In the present exemplary embodiment, the first bit flipping information includes error index information, and the error index information is configured to indicate one or more flipped and/or unflipped first bits among the first bits. For example, the error index information may be represented by a vector e. In the exemplary embodiment illustrated in FIG. 12, the vector e includes a plurality of error index bits, which are respectively "1", "0", "1", "1", "0", "1", "0", "0" and "0" and configured to indicate that the first bits $V_0$, $V_2$, $V_3$ and $V_5$ are flipped in the first iteration decoding procedure.

After the second bits are obtained, the error checking and correcting circuit 208 determines whether the second bits still have errors (also referred to second errors). For example, the error checking and correcting circuit 208 executes the parity check procedure on the second bits to obtain a plurality of syndromes, where each of the second bits is corresponding to at least one of the syndromes. The error checking and correcting circuit 208 determines whether the second bits have one or more second errors according to the syndromes. Herein, the operation of determining whether the second bits have the errors is similar to the operation of determining whether the first bits have the errors and thus, will not be repeatedly described.

In case the second bits do not have the errors, it indicates that the decoding is successful, and the error checking and correcting circuit 208 outputs the second bits. if the second bits have the one or more errors, the error checking and correcting circuit 208 executes another iteration decoding procedure (also referred to as a second iteration decoding procedure) on the second bits so as to obtain a plurality of decoding bits (also referred to as third bits). For example, the error checking and correcting circuit 208 may obtain syndrome weight information of the second bits according to the first bit flipping information and flip at least one of the second bits according to the syndrome weight information of the second bits.

In the present exemplary embodiment, the error checking and correcting circuit 208 performs a scaling operation on the first bit flipping information to generate reference information. The scaling operation referred to herein means that one or more values in the first bit flipping information are increased or decreased. For example, in the scaling operation, the error checking and correcting circuit 208 may multiply the first bit flipping information by a scaling parameter to generate the reference information. Additionally, in another exemplary embodiment, the scaling operation may also include arbitrary logic operations, which is not limited in the present invention. Then, the error checking and correcting circuit 208 adds the reference information to default syndrome weight information of the second bits to obtain the syndrome weight information of the second bits. The aforementioned operation may represented by an equation (7) below.

$$f_2 = S^T \times H + \alpha \times e \qquad (7)$$

Therein, $\alpha$ is the scaling parameter, a value of the $\alpha$ may be an arbitrary integer or positive integer, and a vector $f_2$ may be used to represent the syndrome weight information of each of the second bits.

FIG. 13 is a schematic diagram illustrating a second iteration decoding procedure according to an exemplary embodiment of the present invention.

Referring to FIG. 13, a codeword 1301 is composed of the plurality of second bits generated by the first iteration decoding procedure. A syndrome vector 1302 may be obtained by multiplying the codeword 1301 by the parity check matrix 900. In this exemplary embodiment, the weight corresponding to each syndrome is 1. If it is assumed that $\alpha=1$, and a plurality of error index bits in the first bit flipping information are respectively "1", "0", "1", "1", "0", "1", "0", "0" and "0", the error checking and correcting circuit 208 obtains default syndrome weight information of the second bits and the vector $f_2$ according to the equation (7). The default syndrome weight information of the second bits is respectively "0", "1", "1", "0", "1", "1", "1", "1" and "1", and the syndrome weight information of the second bits is respectively "1", "1", "2", "1", "1", "2", "1", "1" and "1". The error checking and correcting circuit 208 may set the threshold as "2" and that the second bits (i.e., the 3rd and the 6th bits in the codeword 1301) having the syndrome weight information greater than or equal to "2" are to be flipped. Then, a plurality of third bits are output by the second iteration decoding procedure. The third bits are respectively "0", "0", "0", "0", "0", "0", "0", "0" and "0", for example.

The error checking and correcting circuit 208 records bit flipping information (also referred to as second bit flipping information) of the second iteration decoding procedure. Since one or more bits may be flipped in each of the iteration decoding procedures, the second bit flipping information may be different from the first bit flipping information. For example, in correspondence to the second bits that are flipped in the second iteration decoding procedure, the error checking and correcting circuit 208 flips the 3rd and the 6th bits in the vector e and obtains an updated vector e. For example, a plurality of error index bits in the updated vector e are respectively "1", "0", "0", "1", "0", "0", "0", "0" and "0". Namely, the second bit flipping information may also include the updated vector e. According to the second bit flipping information, the error checking and correcting circuit 208 may learn a flipping state of each bit in the codeword in the first and the second iteration decoding procedures. Additionally, in another exemplary embodiment, the first bit flipping information and the second bit flipping information may be presented in other forms, which are not limited in the present invention.

The error checking and correcting circuit 208 determines whether the third bits have errors (also referred to as third errors). If the third bits still have one or more third errors, the error checking and correcting circuit 208 executes yet another iteration decoding procedure (also referred to as a third iteration decoding procedure) on the third bits so as to obtain a plurality of decoding bits (also referred to as fourth bits) and repeats the aforementioned operations. Otherwise, in case the third bits do not have the errors, it indicates that the decoding is successful, and the error checking and correcting circuit 208 outputs the third bits.

Figure 14:
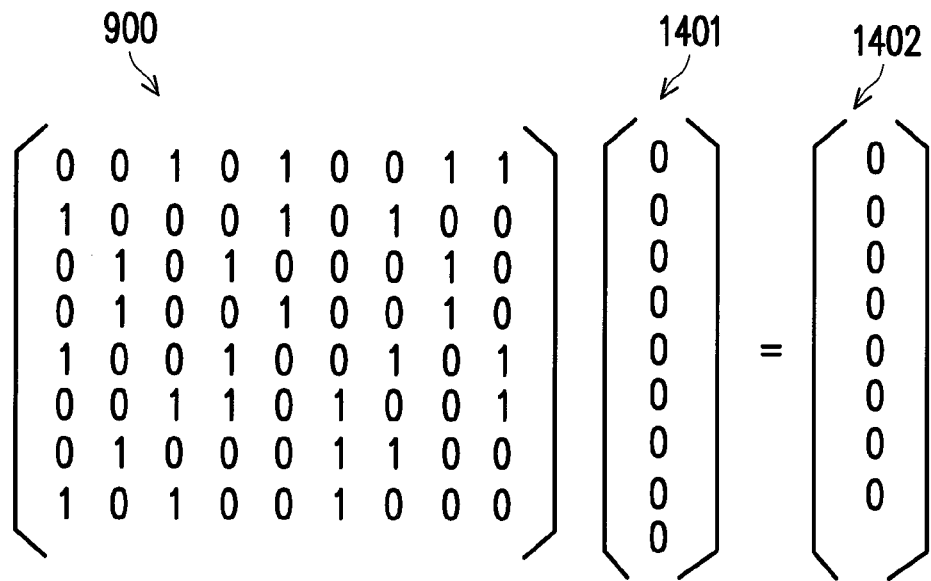
FIG. 14 is a schematic diagram illustrating another matrix multiplication according to an exemplary embodiment of the present invention.

FIG. 14 is a schematic diagram illustrating another matrix multiplication according to an exemplary embodiment of the present invention.

Referring to FIG. 14, a codeword 1401 is composed of the plurality of third bits generated by the second iteration decoding procedure. A syndrome vector 1402 may be obtained by multiplying the codeword 1401 by the parity check matrix 900. Since each of the syndromes in the syndrome vector 1402 is "0", the error checking and correcting circuit 208 determines that the codeword 1401 do not have any error and outputs the third bits of the codeword 1401.

That is, in each of the iteration decoding procedures, the error checking and correcting circuit 208 may record the bit flipping information related to the flipped or the unflipped bits. In the next iteration decoding procedure, the error checking and correcting circuit 208 may read the bit flipping information to accurately locate a bit to be flipped. In this way, the probability of repeatedly flipping the same bit in the codeword in a plurality of iteration decoding procedures may be reduced, such that the decoding efficiency can be enhanced. For instance, taking the exemplary embodiments illustrated in FIG. 11 through FIG. 13 for example, a valid codeword may be obtained through the iteration decoding procedure executed twice. Relatively, a decoding failure may occur if without reference to the bit flipping information.

It should be mentioned that a bit flipping decoding algorithm is implemented in the exemplary embodiments above for example; however, in another exemplary embodiment, any arbitrary decoding algorithm can be implemented in replacement with the bit flipping decoding algorithm, and the present invention is not limited thereto. Additionally, in the exemplary embodiment illustrated in FIG. 12, since no bit is flipped, the bit flipping information can be set as an initial value, for example, the vector e may be set as a zero vector. In this way, the error checking and correcting circuit 208 may consider the syndrome weight information of the first bits as the default syndrome weight information of the second bits and obtain the syndrome weight information of the first bits according to the equation (7). However, in another exemplary embodiment, the initial value of the bit flipping information may be set as arbitrary value, which is not limited in the present invention.

Figure 15:
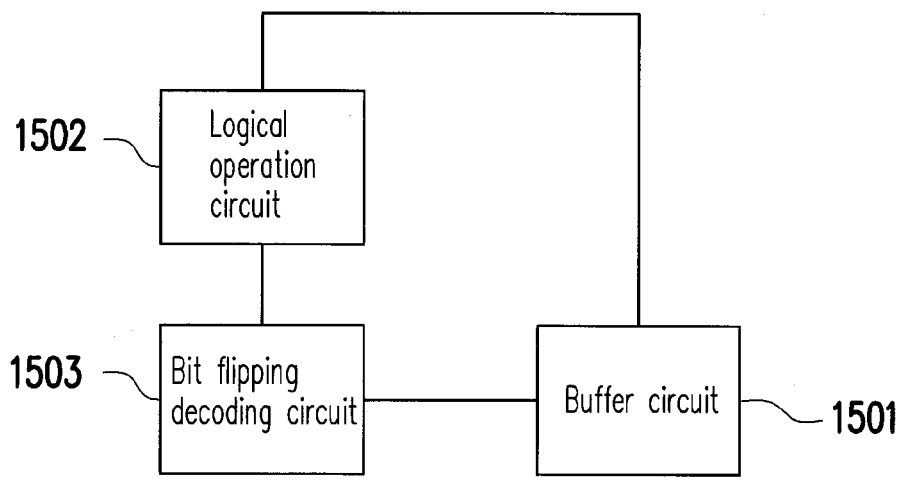
FIG. 15 is a schematic block diagram illustrating an error checking and correcting circuit according to an exemplary embodiment of the present invention.

FIG. 15 is a schematic block diagram illustrating an error checking and correcting circuit according to an exemplary embodiment of the present invention.

Referring to FIG. 15, in the exemplary embodiment, the error checking and correcting circuit 208 includes a buffer memory 1501, a logical operation circuit 1502, and a bit flipping decoding circuit 1503.

The buffer circuit 1501 is configured to store bit flipping information. During the execution of an iteration decoding procedure, the buffer circuit 1501 may transmit bit flipping information to the logic operation circuit 1502. The logical operation circuit 1502 is configured to execute the scaling operation on the bit flipping information and output reference information to the bit flipping decoding circuit 1503. In the present exemplary embodiment, the logic operation circuit 1502 is a multiplying circuit. However, in another exemplary embodiment, the logic operation circuit 1502 may include one or more arbitrary logic operation circuits, and the present invention is not limited thereto. The bit flipping decoding circuit 1503 is configured to receive the reference information so as to execute the aforementioned iteration decoding procedures. Additionally, in another exemplary embodiment, the error checking and correcting circuit 208 may also include arbitrary circuits, and the present invention is not limited thereto.

It should be mentioned that a value of the scaling parameter $\alpha$ may be fixed, or vary with the increase of a total iteration number. For instance, in an exemplary embodiment, the value of the scaling parameter $\alpha$ is relevant to a total iteration number, such as in a negative correlation or in a positive correlation, and the exemplary embodiment below is described by utilizing the negative correlation. In the exemplary embodiments illustrated in FIG. 11 to FIG. 13, the error checking and correcting circuit 208 execute the iteration decoding procedure for twice, and thus, the total iteration number is 2. In another exemplary embodiment, in case the iteration decoding procedure is executed for three times, the value of the scaling parameter $\alpha$ used by the third iteration decoding procedure may probably be greater than the value of the scaling parameter $\alpha$ used by the second iteration decoding procedure. Alternatively, in case the iteration decoding procedure is executed for over thirty times, the value of the scaling parameter $\alpha$ used by the thirtieth iteration decoding procedure may probably be greater than the value of the scaling parameter $\alpha$ used by the twentieth iteration decoding procedure.

In an exemplary embodiment, the value of the scaling parameter $\alpha$ is relevant to a column weight of the parity check matrix, and the exemplary embodiment below is described by utilizing the negative correlation. For example, if the column weight of each column in the parity check matrix is the same (e.g., the column weight of each column in the parity check matrix 900 of the exemplary embodiment illustrated in FIG. 9 is "3"), the scaling parameter $\alpha$ may be obtained according to an equation (8) below.

$$\alpha = 2\delta - \gamma + m \quad (8)$$

Therein, $\delta$ is a threshold (e.g., the threshold used by the first and the second iteration decoding procedures is "2") employed by the current iteration decoding procedure, $\gamma$ is a column weight of the parity check matrix in use, and m is an adjustment factor of the scaling parameter. In case a value of m is decreased, it is highly possible that a flipped bit in the codeword is flipped in the next iteration decoding procedure, and thus, the probability of flipping the correct bit can be reduced. In case the value of m is increased, it is less possible that a flipped bit in the codeword is flipped in the next iteration decoding procedure, and thus, a speed of converging the codeword can be increased.

In an exemplary embodiment, each parameter employed in each of the iteration decoding procedures may vary with the increase of the total iteration number. For instance, in an exemplary embodiment, if none of the bits require to be flipped in one iteration decoding procedure, the threshold as being employed is deducted by "1" in the next iteration decoding procedure. Alternatively, a plurality of iteration decoding procedures may also use one or more parameters of the same. For example, the same threshold $\delta$ and scaling parameter $\alpha$ may be employed in three continuous iteration decoding procedures. For instance, in an exemplary embodiment, after the decoding starts, the iteration decoding procedure having the threshold $\delta$ of "5" and the scaling parameter of "4" is executed first. In case there are bits meeting the flipping condition (e.g., having the syndrome weight information greater than or equal to the threshold) in the three iteration decoding procedures, the threshold $\delta$ remains "5", but the scaling parameter $\alpha$ is changed as "3" in the fourth iteration decoding procedure, and son on, likewise. If no bit requires to be flipped in one of the previous three iteration decoding procedures (e.g., the second iteration decoding procedure), the threshold $\delta$ is changed as "4" and the scaling parameter $\alpha$ is changed as "3" in the next iteration decoding procedure (e.g., the third iteration decoding procedure), and so on, likewise.

Moreover, if the parity check matrix does not have the same column weight, the scaling parameter $\alpha$ may be obtained according to an equation (9) below.

$$\alpha = 2\delta - m \quad (9)$$

In an exemplary embodiment, the equations (8) and (9) may be selectively used to determine the scaling parameter $\alpha$ according to whether the parity check matrix as employed has the same column weight. Additionally, in another exemplary embodiment, the scaling parameter $\alpha$ may also be obtained according to other algorithms or by means of using a look-up table, which is not limited in the present invention.

In an exemplary embodiment, if a codeword CW is determined as an invalid codeword, the error checking and correcting circuit 208 may determine whether the total iteration number reaches a predetermined number. If the total iteration number does not reach the predetermined number, the error checking and correcting circuit 208 executes the next iteration decoding procedure. If the total iteration number reaches the predetermined number, the error checking and correcting circuit 208 may determine that the decoding is failed and stop decoding. In an exemplary embodiment, if determining that the decoding is failed, the error checking and correcting circuit 208 may attempt to re-read the rewritable non-volatile memory module 106 by using the same voltage or different voltages to obtain a new codeword, and the error checking and correcting circuit 208 re-decodes the new codeword.

Figure 16:
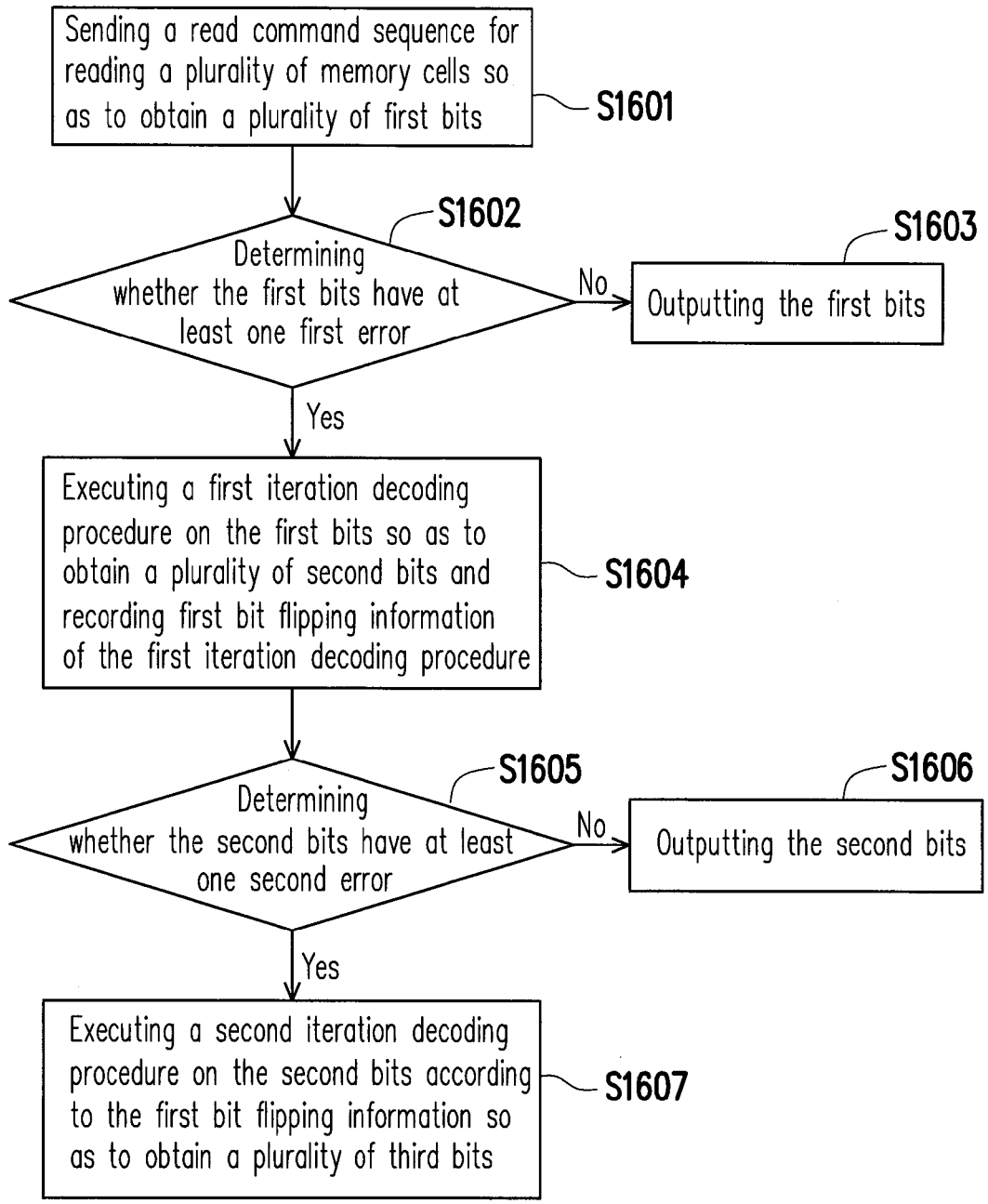
FIG. 16 is a flowchart of a decoding method according to an exemplary embodiment of the present invention.

FIG. 16 is a flowchart of a decoding method according to an exemplary embodiment of the present invention.

Referring to FIG. 16, in step S1601, a read command sequence for reading a plurality of memory cells is sent so as to obtain a plurality of first bits. In step S1602, whether the first bits have at least one first error is determined. If the first bits do not have the at least one first error, in step S1603, the first bits are output. If the first bits have the at least one first error, in step S1604, a first iteration decoding procedure is executed on the first bits so as to obtain a plurality of second bits, and first bit flipping information of the first iteration decoding procedure is recorded. In step S1605, whether the second bits have at least one second error is determined. If the second bits do not have the at least one second error, in step S1606, the second bits are output. If the second bits have the at least one second error, in step S1607, a second iteration decoding procedure is executed on the second bits according to the first bit flipping information so as to obtain a plurality of third bits. In the present exemplary embodiment, a low density parity check algorithm is employed for encoding and decoding in the decoding method. However, in another exemplary embodiment, a BCH code, a convolutional code, a turbo code or any other algorithm may be employed in the decoding method, which is not limited in the present invention.

Nevertheless, each step of FIG. 16 has been described as above and will not repeated hereinafter. It is should be noted that each step illustrated in FIG. 16 may be implemented as a plurality of program codes or circuits, but construes no limitations to the present invention. Additionally, the method illustrated in FIG. 16 may be implemented together with the exemplary embodiments above or may be performed solely, and the present invention is not limited thereto.

To sum up, To sum up, each of the iteration decoding procedures is executed with reference to the historic bit flipping information in the decoding method, the memory storage device and the memory control circuit unit according to one of the exemplary embodiments of the present invention. In this way, the success rate of decoding can be improved even though the decoding algorithm as used has less computational complexity.

The previously described exemplary embodiments of the present invention have the advantages aforementioned, wherein the advantages aforementioned not required in all versions of the present invention.

It will be apparent to those skilled in the art that various modifications and variations can be made to the structure of the present invention without departing from the scope or spirit of the present invention. In view of the foregoing, it is intended that the present invention cover modifications and variations of this invention provided they fall within the scope of the following claims and their equivalents.

What is claimed is:

1. A decoding method, for a rewritable non-volatile memory module comprising a plurality of memory cells, the decoding method comprising:
   sending a read command sequence for reading the plurality of memory cells so as to obtain a plurality of first bits;
   determining whether the first bits have at least one first error;
   if the first bits have the at least one first error, executing a first iteration decoding procedure on the first bits so as to obtain a plurality of second bits, and recording first bit flipping information of the first iteration decoding procedure;
   determining whether the second bits have at least one second error;
   if the second bits have the at least one second error, executing a second iteration decoding procedure on the second bits according to the first bit flipping information so as to obtain a plurality of third bits;
   if the second bits do not have the at least one second error, outputting the second bits;
   recording second bit flipping information of the second iteration decoding procedure according to the first bit flipping information;
   determining whether the third bits have at least one third error;
   if the third bits have the at least one third error, executing a third iteration decoding procedure on the third bits according to the second bit flipping information so as to obtain a plurality of fourth bits; and
   if the third bits do not have the at least one third error, outputting the third bits,
   wherein the second bit flipping information indicates a specific bit among the third bits having a bit value different from an original bit value of said specific bit among the first bits.

2. The decoding method as claimed in claim 1, wherein the first bit flipping information comprises error index information, and the error index information is configured to indicate at least one flipped or unflipped first bit among the first bits.

3. The decoding method as claimed in claim 1, wherein the step of determining whether the second bits have the at least one second error comprises:
  executing a parity check procedure on the second bits to obtain a plurality of syndromes, wherein each of the second bits is corresponding to at least one of the syndromes; and
  determining whether the second bits have the at least one second error according to the syndromes.

4. The decoding method as claimed in claim 1, wherein the step of executing the second iteration decoding procedure on the second bits according to the first bit flipping information so as to obtain the third bits comprises:
  obtaining syndrome weight information of the second bits according to the first bit flipping information; and
  flipping at least one of the second bits according to the syndrome weight information.

5. The decoding method as claimed in claim 4, wherein the step of obtaining the syndrome weight information of the second bits according to the first bit flipping information comprises:
  performing a scaling operation on the first bit flipping information to generate reference information; and
  adding the reference information to default syndrome weight information of the second bits to obtain the syndrome weight information of the second bits.

6. The decoding method as claimed in claim 5, wherein the step of performing the scaling operation on the first bit flipping information to generate the reference information comprises:
  multiplying the first bit flipping information by a scaling parameter, wherein a value of the scaling parameter is negatively correlated with a total number of iterations.

7. The decoding method as claimed in claim 6, wherein the value of the scaling parameter is further negatively correlated with a column weight of a parity check matrix.

8. The decoding method as claimed in claim 1,
  wherein the second bit flipping information is different from the first bit flipping information.

9. The decoding method as claimed in claim 1, wherein a low density parity check algorithm is employed for encoding and decoding in the decoding method.

10. A memory storage device, comprising:
  a connection interface unit, configured to be coupled to a host system;
  a rewritable non-volatile memory module, comprising a plurality of memory cells; and
  a memory control circuit unit, coupled with the connection interface unit and the rewritable non-volatile memory module,
    wherein the memory control circuit unit is configured to send a read command sequence for reading the plurality of memory cells so as to obtain a plurality of first bits,
    the memory control circuit unit is further configured to determine whether the first bits have at least one first error,
    if the first bits have the at least one first error, the memory control circuit unit is further configured to execute a first iteration decoding procedure on the first bits so as to obtain a plurality of second bits, and record first bit flipping information of the first iteration decoding procedure,
    the memory control circuit unit is further configured to determine whether the second bits have at least one second error,
    if the second bits have the at least one second error, the memory control circuit unit is further configured to execute a second iteration decoding procedure on the second bits according to the first bit flipping information so as to obtain a plurality of third bits,
    if the second bits do not have the at least one second error, the memory control circuit unit is further configured to output the second bits,
    the memory control circuit unit is further configured to record second bit flipping information of the second iteration decoding procedure according to the first bit flipping information,
    the memory control circuit unit is further configured to determine whether the third bits have at least one third error,
    if the third bits have the at least one third error, the memory control circuit unit is further configured to execute a third iteration decoding procedure on the third bits according to the second bit flipping information so as to obtain a plurality of fourth bits, and
    if the third bits do not have the at least one third error, the memory control circuit unit is further configured to output the third bits,
    wherein the second bit flipping information indicates a specific bit among the third bits having a bit value different from an original bit value of said specific bit among the first bits.

11. The memory storage device according to claim 10, wherein the first bit flipping information comprises error index information, and the error index information is configured to indicate at least one flipped or unflipped first bit among the first bits.

12. The memory storage device according to claim 10, wherein the operation of the memory control circuit unit determining whether the second bits have the at least one second error comprises:
  executing a parity check procedure on the second bits to obtain a plurality of syndromes, wherein each of the second bits is corresponding to at least one of the syndromes, and
  determining whether the second bits have the at least one second error according to the syndromes.

13. The memory storage device according to claim 10, wherein the operation of the memory control circuit unit executing the second iteration decoding procedure on the second bits according to the first bit flipping information so as to obtain the third bits comprises:
  obtaining syndrome weight information of the second bits according to the first bit flipping information; and
  flipping at least one of the second bits according to the syndrome weight information.

14. The memory storage device according to claim 13, wherein the operation of the memory control circuit unit obtaining the syndrome weight information of the second bits according to the first bit flipping information comprises:
  performing a scaling operation on the first bit flipping information to generate reference information; and
  adding the reference information to default syndrome weight information of the second bits to obtain the syndrome weight information of the second bits.

15. The memory storage device according to claim 14, wherein the operation of the memory control circuit unit performing the scaling operation on the first bit flipping information to generate the reference information comprises:

multiplying the first bit flipping information by a scaling parameter, wherein a value of the scaling parameter is negatively correlated with a total number of iterations.

16. The memory storage device according to claim 15, wherein the value of the scaling parameter is further negatively correlated with a column weight of a parity check matrix.

17. The memory storage device according to claim 10, wherein the second bit flipping information is different from the first bit flipping information.

18. The memory storage device according to claim 10, wherein the memory control circuit unit employs a low density parity check algorithm for encoding and decoding.

19. A memory control circuit unit, configured to control a rewritable non-volatile memory module comprising a plurality of memory cells, the memory control circuit unit comprising:
a host interface, configured to be coupled to a host system;
a memory interface, configured to be coupled to the rewritable non-volatile memory module;
a memory management circuit, coupled with the host interface and the memory interface and configured to send a read command sequence for reading the plurality of memory cells so as to obtain a plurality of first bits; and
an error checking and correcting circuit, coupled to the memory management circuit and configured to determine whether the first bits have at least one first error, wherein
if the first bits have the at least one first error, the error checking and correcting circuit is further configured to execute a first iteration decoding procedure on the first bits so as to obtain a plurality of second bits and record first bit flipping information of the first iteration decoding procedure,
the error checking and correcting circuit is further configured to determine whether the second bits have at least one second error,
if the second bits have the at least one second error, the error checking and correcting circuit is further configured to execute a second iteration decoding procedure on the second bits according to the first bit flipping information so as to obtain a plurality of third bits,
if the second bits do not have the at least one second error, the error checking and correcting circuit is further configured to output the second bits,
the error checking and correcting circuit is further configured to record second bit flipping information of the second iteration decoding procedure according to the first bit flipping information,
the error checking and correcting circuit is further configured to determine whether the third bits have at least one third error,
if the third bits have the at least one third error, the error checking and correcting circuit is further configured to execute a third iteration decoding procedure on the third bits according to the second bit flipping information so as to obtain a plurality of fourth bits, and if the third bits do not have the at least one third error, the error checking and correcting circuit is further configured to output the third bits,
wherein the second bit flipping information indicates a specific bit among the third bits having a bit value different from an original bit value of said specific bit among the first bits.

20. The memory control circuit unit according to claim 19, wherein the first bit flipping information comprises error index information, and the error index information is configured to indicate at least one flipped or unflipped first bit among the first bits.

21. The memory control circuit unit according to claim 19, wherein the operation of the error checking and correcting circuit determining whether the second bits have the at least one second error comprises:
executing a parity check procedure on the second bits to obtain a plurality of syndromes, wherein each of the second bits is corresponding to at least one of the syndromes; and
determining whether the second bits have the at least one second error according to the syndromes.

22. The memory control circuit unit according to claim 19, wherein the operation of the error checking and correcting circuit executing the second iteration decoding procedure on the second bits according to the first bit flipping information so as to obtain the third bits comprises:
obtaining syndrome weight information of the second bits according to the first bit flipping information; and
flipping at least one of the second bits according to the syndrome weight information.

23. The memory control circuit unit according to claim 22, wherein the operation of the error checking and correcting circuit obtaining the syndrome weight information of the second bits according to the first bit flipping information comprises:
performing a scaling operation on the first bit flipping information to generate reference information; and
adding the reference information to default syndrome weight information of the second bits to obtain the syndrome weight information of the second bits.

24. The memory control circuit unit according to claim 23, wherein the operation of the error checking and correcting circuit performing the scaling operation on the first bit flipping information to generate the reference information comprises:
multiplying the first bit flipping information by a scaling parameter, wherein a value of the scaling parameter is negatively correlated with a total number of iterations.

25. The memory control circuit unit according to claim 24, wherein the value of the scaling parameter is further negatively correlated with a column weight of a parity check matrix.

26. The memory control circuit unit according to claim 19, wherein the second bit flipping information is different from the first bit flipping information.

27. The memory control circuit unit according to claim 19, wherein the error checking and correcting circuit employs a low density parity check algorithm for encoding and decoding.

* * * * *